United States Patent [19]

Goldenberg et al.

[11] Patent Number: 4,717,066
[45] Date of Patent: Jan. 5, 1988

[54] METHOD OF BONDING CONDUCTORS TO SEMICONDUCTOR DEVICES

[75] Inventors: Tsvi Goldenberg; Lawrence A. Greenberg, both of Allentown; Kenneth P. Moll, Philipsburg, all of Pa.

[73] Assignee: American Telephone and Telegraph Company, AT&T Bell Laboratories, Murray Hill, N.J.

[21] Appl. No.: 831,814

[22] Filed: Feb. 24, 1986

[51] Int. Cl.⁴ .............................................. B23K 31/02
[52] U.S. Cl. ..................................... 228/179; 228/4.5
[58] Field of Search ...................... 228/179, 159, 4.5; 428/641

[56] References Cited

U.S. PATENT DOCUMENTS 4,330,329  5/1982  Hayashi .............................. 428/641
4,434,347  2/1984  Kurtz .................................. 228/179

*Primary Examiner*—Nicholas P. Godici
*Assistant Examiner*—G. Reid
*Attorney, Agent, or Firm*—Lester H. Birnbaum

[57] ABSTRACT

Disclosed is a method of forming strong bonds between gold spheres and contact pads on semiconductor devices and the resulting product. The spheres are formed by establishing ball bonds with wire bonding techniques and then severing the wire. The wire material is a gold alloy including palladium which forms a weakened portion above the ball bond so that the wire can be easily broken off.

8 Claims, 4 Drawing Figures

METHOD OF BONDING CONDUCTORS TO SEMICONDUCTOR DEVICES

BACKGROUND OF THE INVENTION

This invention relates to formation of electrical contacts to semiconductor devices.

Tape automated bonding (TAB) is one method of forming electrical connections to contact pads on a semiconductor device or circuit. The technique basically involves formation of conductive leads on a tape backing and then bonding the leads to the contact pads on the semiconductor by means of spheres or bumps initially attached to either the pads or the tape leads. The spheres or bumps, hereinafter also referred to as contact portions, act as buffers to absorb the impact of bonding the leads to the pads. The opposite ends of the leads can then be coupled to external circuitry.

TAB provides many advantages over standard techniques, such as wire bonding to lead frames, used in semiconductor fabrication. For example, since TAB leads can usually be made thicker than wire bonded interconnections, the technique generally produces less noise in high frequency applications. Further, since the TAB leads can also be made with a higher density than wire bonded interconnections, TAB is useful in devices requiring a high density of electrical connection to the semiconductor chip due to either a great number of required connections or reduced pad and chip sizes.

In spite of such advantages, TAB has not been employed widely in MOS devices or circuits. This is primarily due to the fact that it has been difficult to form a strong bond between the contact portions and the aluminum pad metallization commonly employed in such devices.

One method proposed for establishing a bond between a bump or sphere and the semiconductor contact pad is to ball-bond a wire to the pad in a manner similar to wire bonding techniques, and then sever the wire above the ball by weakening the wire either through mechanical manipulation or through formation of a coarse crystalline structure above the ball. (See U.S. Pat. No. 4,442,967 issued to van de Pas, which is incorporated by reference herein.) While generally adequate for providing a strong bond, such a technique presents some difficulties in reliably severing the wire.

It is therefore an object of the invention to provide strong bonds between contact portions and semiconductor chip bonding pads in a reliable manner so that conductors can be bonded to the contact portions to provide external connection to the chip.

SUMMARY OF THE INVENTION

This and other objects are achieved in accordance with the invention which in one aspect is a method of forming a contact portion on a metal pad. The method includes the steps of forming a ball on one end of a wire, bonding the ball to the metal pad, and severing the wire from the ball. The wire material comprises gold and palladium.

In accordance with another aspect, the invention is an MOS semiconductor device comprising a semiconductor substrate, a metal pad formed over the substrate, a contact portion bonded to the metal pad, and a conductive lead supported by an insulating tape and bonded to the contact portion. The contact portion is a material comprising gold and palladium.

BRIEF DESCRIPTION OF THE DRAWINGS

These and other features of the invention are delineated in detail in the following description. In the drawing.

It will be appreciated that for purposes of illustration these figures are not necessarily drawn to scale.

DETAILED DESCRIPTION

The basic features of the invention will be described with reference to the embodiment shown in the sequence of steps illustrated in FIGS. 1-4. The figures demonstrate the formation of an electrical contact to one pad, 11, situated on a major surface of a semiconductor substrate, 10. It will be appreciated that in actual practice, the substrate will include several such pads on the periphery of at least one side of the substrate and other elements formed on the surface and within the semiconductor material. For the sake of clarity in the illustration, these additional pads and features have been omitted. In this particular example, the pad, 11, was aluminum with a thickness of approximately 1 micron, and measured 100 microns × 100 microns. The semiconductor substrate, 10, included a standard MOS circuit and measured approximately 200 mils × 200 mils × 20 mils.

A wire, 12, was held within a capillary tube, 14, in a manner similar to U.S. Pat. No. 4,442,967, previously cited. The capillary tube was part of a standard apparatus commonly employed for wire bonding to semiconductor chip pads and so is not shown. In this example, the apparatus was sold by Kolicke and Soffa Industries under the designation Model 1419. The wire had a diameter of approximately 1 mil.

In accordance with an important feature of the invention, the wire material was a gold alloy which was found to have particularly desirable properties in the practice of the method as discussed below. In this example, the material was approximately 99 percent gold and 1 percent palladium.

At the tip of the wire, 12, a ball, 13, was formed in accordance with standard ball-bonding techniques. This involved heating the wire, above its melting point by an electrostatic discharge as commonly employed in the art.

Figure 1:
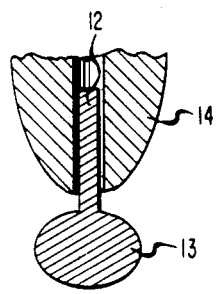
FIGS. 1–4 are cross-sectional schematic views representing different steps in the practice of the invention in accordance with one embodiment.
Figure 2:

As illustrated in FIG. 2, the ball, 13, was then brought into physical contact with the pad, 11, for the purpose of bonding thereto. A thermosonic bonding operation was then performed with approximately 50 grams pressure applied to the ball and heat supplied to the wire and ball by some such as a heated pedestal which supports the substrate in accordance with standard practice. In accordance with a further feature of the invention, the heating step was performed at a higher temperature than normally employed for gold ball-bonding. In this particular example, the pedestal was heated to a surface temperature of approximately 225 degrees C. However, a temperature in the range 175–300 degrees C. should be useful.

It was discovered that use of a gold alloy and an appropriate heating step as described above results not only in a strong between the ball and pad, but also a weakening of the portion, 18, of the wire immediately above the ball. This permits the wire, 12, to be severed from the ball, 13, by pulling on the wire with a simple upward vertical movement of the tube 14.

Figure 3:
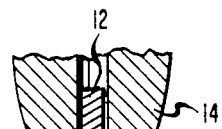

As illustrated in FIG. 3, after severing the wire, a raised contact portion, 17, is left bonded to the pad. This contact portion includes the ball 13 and a small stub, 19, from the wire. Because of the weakening of the wire in accordance with the invention, this stub is quite small, typically 2 mils in height, and so does not significantly affect attachment of conductors to the contact portions.

Figure 4:
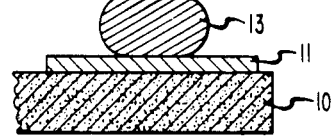

As shown in FIG. 4, a conductive lead, 15, formed on a tape 16, was bonded to the contact portion 17. As is standard in tape automated bonding, the lead was gold-plated copper with a thickness of approximately 1.3 mils and the tape was Kapton with a thickness of approximately 1 mil. One end of the lead was bonded to the contact 17 by thermocompression bonding, leaving the opposite end for attachment to external circuitry as might be present, for example, on a printed circuit board or lead frame.

Although the wire material described above was found to produce desirable results, other wire compositions might be employed. For example, the proportion of the palladium in the gold alloy could be varied. A useful range for the proportion of palladium is expected to be 1-3 percent. Further, additional materials might be incorporated in the gold-palladium alloy, such as beryllium. Further, it may be possible to employ beryllium in sufficient quantity (greater than 1 percent) so that palladium can be eliminated from the composition.

Various additional modifications of the invention will become apparent to those skilled in the art. All such variations which basically rely on the teachings through which the invention has advanced the art are properly considered within the scope of the invention.

What is claimed is:

1. A method of forming a contact portion on a metal pad comprising the steps of forming a ball on one end of a conductive wire, bonding the ball to the metal pad and severing the wire from the ball, characterized in that the wire material comprises 97-99 percent gold and 1-3 percent palladium.

2. A method of forming a contact portion on a metal pad comprising the steps of forming a ball on one end of a conductive wire, bonding the ball to the metal and severing the wire from the ball, characterized in that the wire material consists essentially of gold and palladium.

3. The method according to claim 1 or 2 wherein the pad is disposed on a substrate and the substrate is heated to a temperature within the range 175-300 degrees C. during the bonding of the ball to the pad.

4. The method according to claim 1 or 2 wherein the metal pad comprises aluminum.

5. The method according to claim 1 or 2 further comprising bonding a conductive lead supported by an insulating tape onto the contact portion.

6. The method according to claim 1 or 2 wherein the metal pad is formed over a semiconductor substrate.

7. A method of making electrical contact to an MOS semiconductor chip including an aluminum pad on one major surface comprising the steps of:
    providing a conductive wire consisting essentially of gold and palladium, and forming a ball on one end of the wire;
    bonding the ball to the metal pad by heating the semiconductor substrate in the range 175-300 degrees C. while contacting the ball to the pad;
    severing the wire from the ball by pulling on the wire; and
    bonding a conductive lead supported by an insulated tape onto the ball.

8. The method according to claim 7 wherein the wire is provided in a support tube and the wire is severed from the ball by only an upward movement of the tube.

* * * * *